United States Patent [19]
Lau et al.

[11] Patent Number: 6,122,506
[45] Date of Patent: Sep. 19, 2000

[54] GSM CELLULAR TELEPHONE AND GPS RECEIVER COMBINATION

[75] Inventors: Chung Y. Lau, Sunnyvale; Reed A. Parker, Saratoga; Eric B. Rodal, Morgan Hill, all of Calif.

[73] Assignee: Trimble Navigation Limited, Sunnyvale, Calif.

[21] Appl. No.: 09/072,295

[22] Filed: May 4, 1998

[51] Int. Cl.[7] ........................................ H04Q 7/20
[52] U.S. Cl. .................. 455/427; 455/12.1; 455/552; 455/553
[58] Field of Search ................... 455/12.1, 13.2, 455/76, 427, 456, 260, 552, 553, 314; 342/357, 352

[56] References Cited

U.S. PATENT DOCUMENTS

| | | | |
|---|---|---|---|
| 5,119,504 | 6/1992 | Durboraw, III | 455/13.2 |
| 5,365,450 | 11/1994 | Schuchman et al. | 455/456 |
| 5,535,432 | 7/1996 | Dent | 455/12.1 |
| 5,663,735 | 9/1997 | Eshenbach | 342/357 |
| 5,812,591 | 7/1998 | Shumaker et al. | 455/314 |
| 5,841,396 | 11/1998 | Krasner | 342/357 |
| 5,877,724 | 3/1999 | Davis | 342/357 |

FOREIGN PATENT DOCUMENTS

| | | | |
|---|---|---|---|
| 0745867 A1 | 12/1996 | European Pat. Off. | G01S 5/00 |
| 2307812 A1 | 6/1997 | United Kingdom | G01S 5/14 |
| WO 97/14056 | 4/1997 | WIPO | G01S 5/14 |
| WO 99/13595 | 3/1999 | WIPO | H04B 1/40 |

*Primary Examiner*—Dwayne D. Bost
*Assistant Examiner*—Quochien B. Vuong
*Attorney, Agent, or Firm*—David R. Gildea

[57] ABSTRACT

A GPS/GSM receiver combination for receiving GSM and GPS signals using an RF GPS integrated circuit for downconverting the GPS signal. The GPS integrated circuit includes a synthesizer for generating LO signals, first and second downconverters for using the LO signals for downconverting the GPS signal, and a sampler for providing in-phase and quadrature phase sampled output signals representative of the GPS signal. The synthesizer includes a multi-mode divider for providing substantially the same first LO frequency at about the midpoint of the L1 and L2 GPS frequencies when either of a standard GSM reference frequency or historically common GPS reference frequency is selected. A standby mode in the integrated circuit is controlled by a power logic circuit using a power supply input as a logic control signal. The GSM/GPS receiver combination includes a GSM reference oscillator and a microprocessor system including a GSM frequency correction code for correcting the GSM reference frequency based upon a frequency correction beacon (FCB) signal received in the GSM signal. The GSM-based correction is then used for correcting the GSM reference frequency in order to center a frequency search for acquiring the GPS signal.

22 Claims, 2 Drawing Sheets

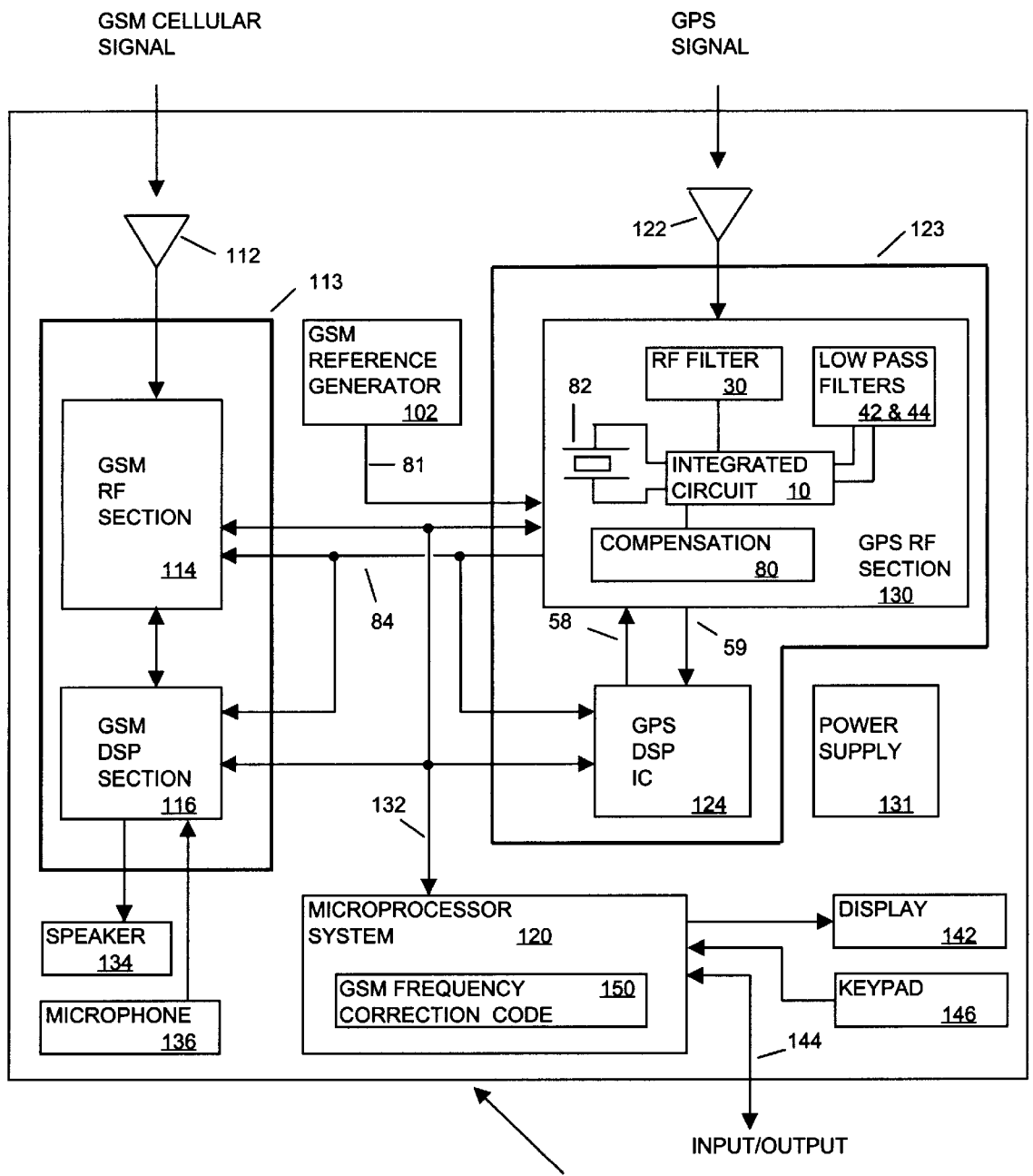
Fig. 2    100

GSM CELLULAR TELEPHONE AND GPS RECEIVER COMBINATION

BACKGROUND OF THE INVENTION

1. Field of the Invention

The invention relates generally to cellular telephones and more particularly to a Global System for Mobile telecommunications cellular telephone and global positioning system (GSM/GPS) receiver combination using a single chip RF integrated circuit having an efficient divider scheme for using either of a GSM standard reference frequency or a second reference frequency for downconverting a GPS signal.

2. Description of the Prior Art

Global Positioning System (GPS) receivers determine location, velocity, and time by receiving and processing information in GPS signals received from GPS satellites that have been placed in orbit around the Earth by the United States Government. The GPS signal from each satellite carries data for the location-in-space of the satellite and time-of-transmission on carrier frequencies that are the same for all the satellites. The data from each satellite is spread with a pseudo-random noise (prn) code that is distinct for that satellite. A GPS receiver uses the distinct prn code for distinguishing the GPS signals from typically at least four satellites and then finds its own location, velocity, and time by solving simultaneous equations using the relative times that the signal from each of the satellites arrives at the receiver and the locations-in-space and times-of-transmission from the satellites.

There is a continuous need for improving the performance of GPS receivers in terms of accuracy, acquisition and tracking of low level signals, acquisition time, and immunity to interference. And, there is a continuous need for reducing the size, power consumption, and cost of the GPS receiver. One of the major components in determining the performance, size, power, and cost in the GPS receiver is the radio frequency (RF) circuitry at the front end for downconverting the GPS satellite carrier frequency to an intermediate or baseband frequency. A second major component is the digital signal processor (DSP) circuitry for processing the signal at the intermediate or baseband frequency for providing GPS signal correlations. Due to the relatively high frequency of the GPS satellite signal, most GPS receivers until recently have used discrete components for the front end RF circuitry. Although the performance of such RF circuitry may be very good, these discrete components represent a large portion of the size, power, and cost of a modern GPS receiver. Gallium Arsenide (GaAs) integrated circuits (IC)s have been developed using field effect transistors (FET)s as active devices for replacing the majority of the discrete components in the RF circuitry. Unfortunately, GaAs ICs have been and continue to be relatively expensive because the commercial manufacturing volume of GaAs ICs is low and because the GaAs material is more expensive than Silicon and the processing steps in manufacturing a GaAs IC are relatively difficult. Silicon bipolar ICs using bipolar transistors as active devices have been used for the front end RF circuitry in the GPS receiver. Such ICs can be more difficult to design because the frequency response, noise figure, and power consumption for the silicon IC bipolar transistors are typically not as good as for the GaAs IC FETs. However, the silicon bipolar ICs are less costly and have recently been shown to have sufficient performance for most applications. There continues to be a need for improvements in RF ICs in order to improve performance and reduce size, power consumption, and cost in a GPS receiver.

Cellular telephones are commonly used together with GPS receivers for communicating the location of the receiver. In most of these uses the location is read by a human user from a stand alone GPS receiver and then spoken into a stand alone cellular telephone. In an improvement over this system, the location is communicated electronically from the GPS receiver to the cellular telephone using a digital interface. Recently, GPS receivers and cellular telephones have been packaged together for reducing their combined cost and size by sharing the same housing and power supply. However, in existing systems where a GPS receiver and a cellular telephone coexist in the same package they share little functionality and little or nothing has been done to take advantage of the circuitry and functions of the cellular telephone for improving the performance and reducing the cost of the GPS receiver. There is a need for a GPS receiver and cellular telephone combination that uses circuitry of the cellular telephone for improving the performance and reducing the cost of the GPS receiver.

SUMMARY OF THE INVENTION

It is therefore an object of the present invention to provide a global system for mobile telecommunications cellular telephone and global positioning system (GSM/GPS) receiver combination using a GSM signal for correcting the frequency of an internal reference signal for reducing the GPS signal acquisition time of the GPS receiver.

Another object of a GSM/GPS receiver combination of the present invention is to share a GSM reference oscillator by a GSM receiver and a GPS receiver.

Another object of the present invention is to provide a single radio frequency (RF) GPS integrated circuit (IC) for downconverting either an L1 or an L2 GPS signal using either a standard GSM reference frequency or a historically common GPS reference frequency as a frequency reference.

Briefly, in a preferred embodiment, a GPS RF integrated circuit (IC) of the present invention includes a synthesizer for providing a first local oscillator (LO) signal and a complex second LO signal, a first downconverter using the first LO signal for converting a GPS L1 or L2 frequency signal to a first intermediate frequency (IF) signal, a second downconverter using the second LO signal for converting the first IF signal to a complex second IF signal, and a sampler using a clock signal received from a GPS DSP IC for sampling the second IF signal and issuing I and Q sampled signals. Either the L1 frequency or the L2 frequency is selected in an RF filter before the GPS signal reaches the GPS RF IC. The frequency of the first LO signal is at about the mid-point of the L1 and L2 frequencies so that the first and second intermediate frequencies are substantially equal for receiving the L1 or L2 frequencies by using mixing products for frequency differences where the incoming GPS signal is higher or lower, respectively, than the frequency of the LO signal. The synthesizer includes an amplifier/oscillator for selectably receiving an external reference signal at a standard GSM reference frequency of about thirteen megahertz or generating an internal reference signal using an external resonator at a historically common GPS reference frequency about twelve and one-half megahertz; and a multi-mode divider for frequency dividing the second LO signal by a first or a second divide number so that the first and second LO frequencies do not change significantly when the reference frequency is changed. The first divide number is a ratio formed by alternating two integer divide numbers in repeating sequences.

A GSM/GPS receiver combination of the present invention includes a GSM reference oscillator; a GSM cellular telephone receiver; a GPS receiver including the GPS DSP IC and a GPS RF section including the RF GPS IC; a power supply; and a microprocessor system. The GSM reference oscillator provides a GSM reference signal for the external reference signal to the GPS RF IC. The GPS RF IC then issues the GSM reference signal to the GPS DSP IC and the GSM receiver. The GSM receiver receives a GSM signal including communication information and a frequency correction beacon (FCB) signal including a frequency having a frequency standard accuracy and provides the microprocessor system with information for a frequency difference between the frequency of the GSM reference signal and the frequency that the GSM reference signal would be if it were derived from the same frequency standard as the FCB signal. The GSM-based frequency difference is passed from the GSM receiver to the microprocessor system.

The GPS receiver receives the GPS signal including location-determination information and passes GPS correlation signals to the microprocessor system. The microprocessor system uses the correlation signals for determining when the GPS signal has been acquired and, after the GPS signal has been acquired, for determining location, velocity, and time. In order to acquire the GPS signal the microprocessor system calculates an expected frequency offset for correcting a frequency difference between the frequency of the reference signal that has been selected and the frequency that it would be if were derived from the same frequency standard as the GPS signal. The GPS DSP IC uses the expected frequency offset for offsetting the reference frequency and then uses the offset reference frequency as the basis for generating a replica signal. The replica signal is correlated with the GPS signal for providing correlation signals that indicate when the GPS signal has been acquired. When the GPS signal cannot be acquired with the expected frequency offset, the microprocessor system increments or decrements the expected frequency offset in a search pattern until the GPS signal is acquired. In the present invention the microprocessor system includes a frequency correction code using the GSM-based frequency difference for improving the accuracy of the expected frequency offset for the GSM reference frequency. Because both the FCB signal and the GPS signal are typically derived from atomic standards, the use of the GSM-based frequency difference reduces or eliminates the number of increments and decrements to the frequency offset that must be searched in order to acquire the GPS signal thereby reducing the time required to acquire the GPS signal.

An advantage of a GSM/GPS receiver combination of the present invention is that GPS signal acquisition time is reduced (improved) by using a GSM signal including a frequency correction beacon (FCB) signal for correcting the accuracy of a locally generated GSM reference frequency.

Another advantage of the present invention is that a GSM reference oscillator is shared by a GSM receiver and a GPS receiver, thereby reducing the cost of a GSM/GPS receiver combination of the present invention.

Another advantage of the present invention is that a single RF GPS integrated circuit can use historically common reference frequencies for either GSM or GPS for downconverting an L1 or L2 GPS signal, thereby increasing its volume and the applications in which it can be used without modification.

These and other objects and advantages of the present invention will no doubt become obvious to those of ordinary skill in the art after having read the following detailed description of the preferred embodiments which are illustrated in the various figures.

IN THE DRAWINGS

FIG. 1 is a block diagram of a RF GPS integrated circuit downconverter of the present invention; and FIG. 2 is a block diagram of a GSM cellular telephone receiver and GPS receiver combination of the present invention using the integrated circuit of FIG. 1.

DETAILED DESCRIPTION OF THE PREFERRED EMBODIMENTS

Figure 1:
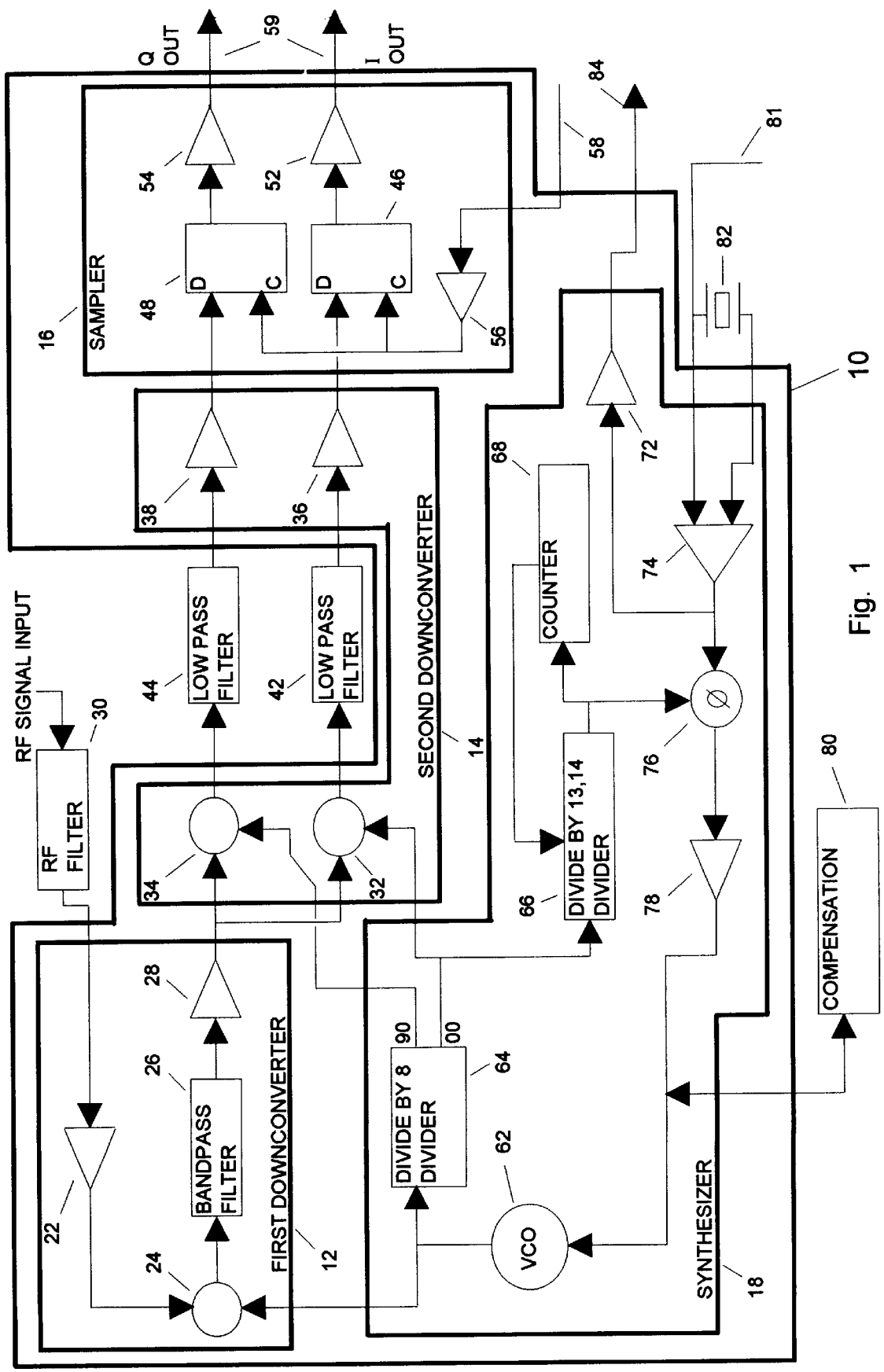

FIG. 1 illustrates a radio frequency (RF) integrated circuit of the present invention referred to by the general reference number 10 for receiving a global positioning system (GPS) signal. The integrated circuit 10 includes a first downconverter 12, a second downconverter 14, a sampler 16, and a synthesizer 18. The first downconverter 12 includes a low noise amplifier (LNA) 22, a mixer 24, a low pass filter 26, and an amplifier 28 for receiving a radio frequency input signal. Typically, the RF signal passes through an RF filter 30 before reaching the integrated circuit 10. The LNA 22 receives an RF input signal from outside the integrated circuit 10 and passes an amplified RF signal to the mixer 24. The mixer 24 uses a first local oscillator ($LO_1$) signal received from the synthesizer 18 to downconvert the frequency of the amplified RF signal and passes the downconverted signal to the low pass filter 26. The low pass filter 26 filters the downconverted signal and passes a filtered signal to the amplifier 28. The amplifier 28 amplifies the filtered signal and passes the amplified signal as a first intermediate frequency (IF) signal the second downconverter 14.

The second downconverter 14 includes a pair of mixers 32 and 34 and a pair of amplifiers 36 and 38. The first IF signal is split and passed to each of the mixers 32 and 34. The mixer 32 uses an in-phase (I) component of a complex second local oscillator ($LO_2$) signal received from the synthesizer 18 to downconvert the first IF signal to an I channel second IF signal; and the mixer 34 uses a quadrature (Q) component of the complex $LO_2$ signal received from the synthesizer 18 to downconvert the first IF signal to a Q channel second IF signal. The I and Q channels of the complex second IF signal are passed off chip through low pass filters 42 and 44 and received back on chip to the amplifiers 36 and 38. The amplifiers 36 and 38 amplify the signals and pass the I and Q signals to the sampler 16.

The sampler 16 includes a pair of D flip-flops 46 and 48, a pair of output amplifiers 52 and 54, and a clock input amplifier 56. The clock input amplifier 56 amplifies a sampling clock input signal from a path 58 and passes the amplified clock signal to clock inputs (C) of the D flip-flops 46 and 48. The D flip-flops 46 and 48 receive the I and Q second IF signal components at D inputs and use an edge of the amplified clock signal for providing sampled I and Q output signals, respectively. The sampled I and Q signals are amplified by the output amplifiers 52 and 54 and then passed out of the integrated circuit 10 as I and Q output signals to a path 59.

The synthesizer 18 includes a voltage controlled oscillator 62, a divide-by-eight divider 64, a divide-by-thirteen, fourteen divider 66, a counter 68, a clock output amplifier 72, a reference amplifier/oscillator 74, a phase detector ($\phi$) 76, and an error voltage amplifier 78. The divide-by-eight divider 64 uses a divide-by-two divider followed by a divide-by-four Johnson counter to establish a fixed 90° phase offset between two divide-by-four outputs. The VCO 62, the divider 64, the divider 66, the phase detector 76, the error voltage amplifier 78, and an off chip compensation circuit 80 act as a phase lock loop to synchronize the frequency of the $LO_1$ and $LO_2$ signals to a reference signal from a path 81 having a reference frequency of either thirteen megahertz or twelve point five zero four (12.504) megahertz. The VCO 62 generates the $LO_1$ signal having a frequency controlled by an amplified error voltage signal provided by the error voltage amplifier 78. The $LO_1$ signal is frequency divided by eight by the divider 64 and split into the $LO_2$ I (0°) and Q (90°) components used in the second downconverter 14. The $LO_2$ I component is frequency divided by either thirteen or fourteen in the divider 66 as controlled by a divide selection signal from the counter 68. The divider 66 then passes a frequency divided feedback signal to the counter 68 and the phase detector 76.

The reference amplifier/oscillator 74 uses positive feedback around a differential amplifier for generating the reference signal or uses the differential amplifier for amplifying an externally generated reference signal. For operation as an oscillator, a crystal resonator 82 having a desired resonant frequency is connected between two emitter coupled inputs to the amplifier/oscillator 74. For operation as an amplifier the inputs of the amplifier/oscillator 74 receive the externally generated reference signal from the path 81. The reference amplifier/oscillator 74 passes the reference signal to the phase detector 76. The phase detector 76 provides an error voltage proportional to a difference in phases between the amplified reference signal and the feedback signal received from the divider 66. The compensation circuit uses a capacitor or a combination of one or more capacitors and/or resistors for frequency stability by adding the appropriate poles and zeros for stabilizing the loop. The clock output amplifier 72 receives the reference signal from the reference amplifier/oscillator 74 and issues a reference signal output to a path 84.

The integrated circuit 10 has a first mode using the thirteen megahertz reference frequency and a second mode using the twelve point five zero four megahertz reference frequency. The feedback signal provided by the divider 66 is a pulse stream having an average pulse rate that is driven by the action of the loop to match the frequency of the reference signal. The divide select signal provided by the counter 68 causes the divider 66 to divide by thirteen or by fourteen. In the first mode the counter 68 counts the frequency divided signal from the divider 66 to fifteen and provides a divide select signal causing the divider 66 to frequency divide the $LO_2$ frequency in repeating sequences of 13, 14, 13, 14, 13, 14, 13, 14, 13, 14, 13, 14, 13, 14, and 13. The average divide number in the divider 66 is found by dividing the sum of thirteen times eight plus fourteen times seven by the sum of eight plus seven. Equation 1 below shows the average divide number in a general form.

$$\text{Divide number} = (A_N * A_t + B_N * B_t)/(A_t + B_t) \quad (1$$

In a preferred embodiment of the generalized equation 1, $A_N$ is thirteen, $A_t$ is eight, $B_N$ is fourteen, and $B_t$ is seven, the average divide number equals two-hundred two divided by fifteen (202/15) or thirteen point four followed by sixes (13.466666). Accordingly, in the first mode, the $LO_2$ signal has a nominal frequency of about 175.067 megahertz and the $LO_1$ signal has a nominal frequency of about 1400.533 megahertz. In the second mode the counter 68 provides the divide selection signal having the second logic level thereby controlling the divider 66 to divide by fourteen. Accordingly, in the second mode $LO_2$ signal has a nominal frequency of 175.056 megahertz and the $LO_1$ signal has a nominal frequency of 1400.448 megahertz. For an L1 GPS frequency of 1575.42 megahertz, the first downconverted signal has a center frequency of approximately 174.887 megahertz or 174.972 megahertz for the first and second modes, respectively; and the second downconverted signal has a center frequency of approximately 180 kilohertz or 84 kilohertz for the first and second modes, respectively. For an L2 GPS frequency of 1227.60 megahertz, the first downconverted signal has a center frequency of approximately 172.933 megahertz or 172.848 megahertz for the first and second modes, respectively, and the second downconverted signal has a center frequency of about 2.13 megahertz or about 2.21 megahertz in the first and second modes, respectively. Importantly, the center frequencies of the first IF signals for the L1 and L2 GPS frequencies for either reference frequency are close enough to enable the integrated circuit 10 to use a single low pass filter 26 and the second IF frequency is low enough for the sampled signals to be inexpensively processed by a following digital processor. It will be appreciated that the above scheme is not limited to an average divide number of two-hundred two divided by fifteen or for reference frequencies of only thirteen and twelve point five zero four megahertz. The sampling clock input signal on the path 58 has a frequency that is equal or harmonically related to the reference frequency. In preferred a embodiment the frequency of the sampling clock input is ¼ of the reference frequency or 3.25 megahertz or 3.126 megahertz for the preferred first or second modes, respectively.

FIG. 2 illustrates a global system for mobile telecommunication cellular and global positioning system (GSM/GPS) receiver combination of the present invention referred to by the general reference number 100. The GSM/GPS receiver 100 includes a GSM reference generator 102; a GSM antenna 112; a GSM receiver 113 including a GSM RF section 114 and a GSM digital signal processor (DSP) section 116; a microprocessor system 120, a GPS antenna 122; a GPS receiver 123 including a GPS DSP IC 124 and associated circuitry and a GPS RF section 130, and a power supply 131. The GSM reference generator 102 provides a GSM reference signal to the GPS RF section 130 on the path 81 at the standard GSM reference frequency of thirteen megahertz. The GPS RF section 130 includes the integrated circuit 10, the RF filter 30, the low pass filters 42 and 44, the compensation 80, and the crystal resonator 82 all of which are illustrated in FIG. 1 and described in the accompanying detailed description. The GPS RF section 130 selects the GSM reference signal or generates the reference signal using the resonator 82 and then distributes the selected reference signal through the path 84 to the GSM RF section 114, the GSM DSP section 116, and the GPS DSP IC 124; thereby eliminating the requirement of having a separate reference clock generator for each of the GSM circuitry and the GPS circuitry. The GPS DSP IC 124 passes the reference signal from the path 84 back to the GPS RF section 130 through the path 58 or divides the frequency of the reference signal by a number such as four and returns the divided signal back to the GPS RF section 130 through the path 58 as the sampling clock input signal.

The GSM antenna 112 receives an airwave RF signal transmitted according to the GSM cellular standard and passes a representative conducted GSM RF signal to the GSM RF section 114. The GSM RF section 114 frequency downconverts the RF signal and passes the information in the signal to the GSM DSP section 116 at a lower frequency. The GSM DSP section 116 processes the information according to instructions received from the microprocessor system 120 through a signal bus 132 having address and data, and outputs voice information through a speaker 134.

In the other direction, a microphone 136 passes voice information to the GSM DSP section 116 which is passed in a low frequency signal to the GSM RF section 114 and to the GSM antenna 112 for transmission.

The GPS antenna 122 receives a GPS RF signal and passes the signal to the GPS RF section 130. The GPS RF section 130 downconverts the RF signal to representative I and Q low frequency signals as described above and passes the I and Q signals through the path 59 and the reference signal through the path 84 to the GPS DSP IC 124. The GPS DSP IC 124 cooperates with the microprocessor system 120 over the bus 132 to acquire and track the GPS signal by generating a replica signal and correlating and synchronizing the replica signal to the sampled (I) and (Q) signals. While the GPS signal is being tracked, the GPS DSP IC 124 passes correlation signals including GPS location-determination information for the health and locations-in-space, phase observations, and Doppler frequencies of the GPS satellites over the bus 132 to the microprocessor system 120. Details of the downconversion and correlation of the GPS signal are described in U.S. Pat. No. 4,672,629 entitled "Receiver for Bandspread Signals" by Beier and U.S. Pat. No. 5,402,347 entitled "Satellite Search Methods For Improving Time To First Fix In A GPS Receiver" by McBurney et al. The teachings of these patents are incorporated herein by reference. The microprocessor system 120 then uses the GPS information for calculating the location and velocity of the GPS antenna 122 and time. The processed information for location, velocity, and/or time is then passed to a display 142 for visual presentation, through a path 144 as a serial digital output, and/or to the GSM DSP section 116 for output through the GSM RF section 114 and GSM antenna 112. A user enters requests to the microprocessor system 120 through a keypad 146 or in a serial digital input through the path 144. The microprocessor system 120 includes a memory including a pre-programmed code for processing the requests and controlling the elements of the GSM/GPS receiver 100.

The GSM RF receiver 113 has a standby mode controlled by pre-programmed code in the microprocessor system 120 for reducing power consumption when no GSM communication is being transmitted or received. The GSM cellular signal includes a frequency correction beacon (FCB) signal having a known precise frequency offset of fifty-seven kilohertz from its carrier typically derived from an atomic clock. During the standby mode, the GSM receiver 113 periodically compares the reference frequency to the frequency of the FCB signal and provides information for a measured reference frequency using the frequency of the FCB signal as the standard to the microprocessor system 120 over the bus 132. The microprocessor system 120 includes a pre-programmed executable GSM frequency correction code 150 for directing the GSM receiver 113 for measuring the reference frequency and calculating a reference frequency correction based upon a difference between the measured reference frequency and the known frequency of the FCB signal. The frequency correction is then used along with other information such as the expected Doppler frequency offsets for the GPS satellites for calculating an expected frequency offset for the reference frequency and providing information for the expected offset to the GPS DSP IC 124 over the bus 132. The GPS DSP IC 124 then uses the expected frequency offset for adjusting the reference frequency to an initial center frequency that is used for generating a replica signal for correlating to the GPS signal and passes correlation signals over the bus 132 to the microprocessor system 120. When the correlation exceeds a correlation threshold the GPS signal is considered to have been acquired and continuing information in the correlation signals is used by the microprocessor system 120 for determining location and velocity of the GPS antenna 122 and time. If, after following a preprogrammed acquisition procedure, the correlation threshold is not exceeded, the microprocessor system 120 searches for the frequency of the GPS signal by incrementing and/or decrementing the frequency offset and follows acquisition procedure again. Because the center frequency used initially is transferred from the more accurate frequency of the FCB signal, the range of frequencies that must be searched is reduced, thereby decreasing the time for acquiring the GPS signal. Further details of the GPS acquisition procedure are disclosed in the U.S. Pat. No. 5,402,347 by McBurney incorporated herein by reference.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A GSM/GPS receiver combination for receiving a global system for mobile telecommunications (GSM) signal including a frequency correction beacon (FCB) signal and information for a GSM communication, and a global positioning system (GPS) signal including information for a GPS location, the GSM/GPS receiver combination comprising:

a GSM reference oscillator for providing a GSM reference signal having a GSM reference frequency;

a GSM receiver for using said GSM reference signal for receiving said GSM signal and providing said GSM communication;

an executable GSM frequency correction code for directing the GSM receiver for using said FCB signal and said GSM reference frequency for calculating a GSM-based frequency correction;

a GPS receiver for using said GSM reference signal and said GSM-based frequency correction for receiving said GPS signal and providing a GPS correlation signal; and a microprocessor system for executing said GSM frequency correction code and cooperating with the GPS receiver for processing said GPS correlation signal for providing said GPS location.

2. The receiver combination of claim 1, wherein:

the GPS receiver includes a GPS digital signal processing (DSP) section for using said GSM reference frequency and said GSM-based frequency correction for centering a frequency search for acquiring said GPS signal.

3. The receiver combination of claim 1, wherein:

said GSM reference frequency is about thirteen megahertz.

4. A method for receiving a global system for mobile telecommunications (GSM) signal including a GSM frequency correction beacon (FCB) signal and information for a GSM communication, and a global positioning system (GPS) signal including information for a GPS location in a GSM/GPS receiver combination, the method comprising steps of:

generating a GSM reference signal having a GSM reference frequency;

using said GSM reference signal for receiving said GSM signal and providing said GSM communication information;

comparing said GSM reference frequency to a frequency of said FCB signal for providing a GSM-based frequency correction;

using said GSM reference signal and said GSM-based frequency correction for receiving said GPS signal and providing a GPS correlation signal; and processing said GPS correlation signal for providing said GPS location.

5. The method of claim 4, wherein:

said step of using said GSM reference signal and said GSM-based frequency correction for receiving said GPS signal includes using said GSM reference frequency and said GSM-based frequency correction for centering a frequency search for said GPS signal.

6. The method of claim 4, wherein:

said standard GSM reference frequency is about thirteen megahertz.

7. A GSM/GPS receiver combination for receiving a global system for mobile telecommunications (GSM) signal including information for a GSM communication and a global positioning system (GPS) signal including information for a GPS location, comprising:

a GSM reference oscillator for providing a GSM reference signal;

a GSM receiver for using said GSM reference signal for receiving said GSM signal having a GSM reference frequency and providing said GSM communication;

a GPS receiver for receiving said GPS signal, the GPS receiver including a circuit for selecting a reference signal of one of (i) said GSM reference signal and (ii) a second reference signal having a second reference frequency not equal to said GSM reference frequency and using said selected reference signal for providing a GPS correlation signal; and a microprocessor system for cooperating with the GPS receiver for processing said GPS correlation signal for providing said GPS location.

8. The receiver combination of claim 7, wherein:

the GPS receiver includes a synthesizer for generating a local oscillator (LO) signal from said selected reference signal, said LO signal having substantially the same frequency for either of (i) said GSM reference signal and (ii) said second reference signal; a downconverter using said LO signal for downconverting said GPS signal and providing a downconverter output signal; and a GPS digital signal processor (DSP) for using said downconverter output signal and said selected reference signal for providing said GPS correlation signal.

9. The receiver combination of claim 8, wherein:

said LO signal has a frequency approximately the midpoint of an L1 frequency and an L2 frequency of said GPS signal.

10. The receiver combination of claim 8, wherein:

said synthesizer includes a phase detector coupled to the amplifier/oscillator for receiving said selected reference signal and providing an error signal corresponding to a phase difference between said selected reference signal and a feedback signal; a local oscillator for providing said LO signal having an LO frequency corresponding to said error signal; and a multi-mode divider for frequency dividing said LO signal by a selected one of a first divide number for providing said feedback signal having said GSM reference frequency or a second divide number for providing said feedback signal having said second reference frequency.

11. The receiver combination of claim 10, wherein:

at least one of said first divide number and said second divide number has an average of a ratio having an integer numerator and an integer denominator, said denominator greater than one.

12. The receiver combination of claim 10, wherein:

said multi-mode divider is further for providing said average divide number by alternating a divide number $A_N$ band a divide number $B_N$ in repeating sequences, each of said sequences beginning in said divide number $A_N$ and ending in said divide number $A_N$ for providing said feedback signal.

13. The receiver combination of claim 12, wherein:

at least one of said first divide number and said second divide number is an integer number.

14. The receiver combination of claim 8, wherein:

said LO signal includes a first LO signal and a complex second LO signal at a sub-multiple of said first LO signal; and said downconverter includes a first downconverter for using said first LO signal for providing a first intermediate frequency (IF) signal, a second downconverter for using said second LO signal for providing a complex second IF signal, and a sampler for sampling said second IF signal for providing said downconverter output signal having in-phase (I) and quadrature phase (Q) components.

15. A method for receiving a global system for mobile telecommunications (GSM) signal including information for a GSM communication and a global positioning system (GPS) signal including information for a GPS location in a GSM/GPS receiver combination, comprising steps of:

generating a GSM reference signal having a GSM reference frequency;

using said GSM reference signal for receiving said GSM signal and providing said GSM communication information;

selecting a reference signal from one of (i) said GSM reference signal and (ii) a second reference signal having a second reference frequency not equal to said GSM reference frequency; and using said selected reference signal for receiving said GPS signal and providing a GPS correlation signal; and processing said GPS correlation signal for providing said GPS location.

16. The method of claim 15, wherein:

the step of receiving said GPS signal further includes steps of: generating a local oscillator (LO) signal from said selected reference signal, said LO signal having substantially the same frequency for either of (i) said GSM reference signal and (ii) said second reference signal; using said LO signal for downconverting said GPS signal and deriving said GPS correlation signal from said downconverted signal.

17. The method of claim 16, wherein:

said LO signal has a frequency approximately the midpoint of an L1 frequency and an L2 frequency of said GPS signal.

18. The method of claim 16, wherein:

said step of generating said LO signal includes steps of phase comparing said selected reference signal to a feedback signal for providing an error signal; using said error signal for generating said LO signal; and frequency dividing said LO signal by a selected one of a first divide number for providing said feedback signal having said GSM standard reference frequency or a second divide number for providing said feedback signal having said second reference frequency.

19. The method of claim 18, wherein:

at least one of said first divide number and said second divide number has an average of a ratio having an integer numerator and an integer denominator, said denominator greater than one.

20. The method of claim 19, wherein:

said step of frequency dividing said LO signal includes a step of frequency dividing by alternating a divide number $A_N$ and a divide number $B_N$ in repeating sequences where each of said sequences begins in said divide number $A_N$ and ends in said divide number $A_N$.

21. The method of claim 20, wherein:

at least one of said first divide number and said second divide number is an integer number.

22. The method of claim 16, wherein:

said LO signal includes a first LO signal and a complex second LO signal at a sub-multiple of said first LO signal; and said step of downconverting said GPS signal includes steps of: using said first LO signal for providing a first intermediate frequency (IF) signal; using said second LO signal for providing a complex second IF signal; and sampling said second IF signal for providing said downconverter output signal having in-phase (I) and quadrature phase (Q) components.

* * * * *